(12) United States Patent
Venema et al.

(10) Patent No.: US 12,202,007 B2
(45) Date of Patent: Jan. 21, 2025

(54) TRANSPARENT SUPERHYDROPHOBIC COMPOSITION

(71) Applicant: UNITED PROTECTIVE TECHNOLOGIES, LLC, Locust, NC (US)

(72) Inventors: Peter Craig Venema, Clayton, NC (US); Brent William Barbee, Stanfield, NC (US); Michael Raymond Greenwald, Matthews, NC (US)

(73) Assignee: UNITED PROTECTIVE TECHNOLOGIES, LLC, Locust, NC (US)

(*) Notice: Subject to any disclaimer, the term of this patent is extended or adjusted under 35 U.S.C. 154(b) by 0 days.

(21) Appl. No.: 16/942,738

(22) Filed: Jul. 29, 2020

(65) Prior Publication Data
US 2021/0031232 A1  Feb. 4, 2021

Related U.S. Application Data

(60) Provisional application No. 62/880,525, filed on Jul. 30, 2019.

(51) Int. Cl.
G02B 1/118   (2015.01)
B05D 1/00    (2006.01)
(Continued)

(52) U.S. Cl.
CPC ............... B05D 1/60 (2013.01); B05D 1/62 (2013.01); B05D 3/142 (2013.01); B05D 3/145 (2013.01); C03C 11/005 (2013.01); C03C 17/30 (2013.01); C09D 4/00 (2013.01); C23C 14/10 (2013.01); C23C 14/5873 (2013.01);
(Continued)

(58) Field of Classification Search
CPC . C03C 17/30; C03C 2217/76; C03C 2217/77; C03C 2217/775; G02B 1/18; G02B 2207/107; G02B 1/10–14
See application file for complete search history.

(56) References Cited

U.S. PATENT DOCUMENTS

2012/0088066 A1* 4/2012 Aytug ................. C03C 17/02
                                                216/37
2012/0176681 A1* 7/2012 Chang ............... C23C 18/1216
                                                977/773
(Continued)

FOREIGN PATENT DOCUMENTS

WO   WO-2019074900 A1 * 4/2019 ............. B60J 3/007

OTHER PUBLICATIONS

Lin et al., "Robust superhydrophobic transparent coatings fabricated by a low-temperature sol-gel process", Applied Surface Science, 305, 2014, p. 702-709. (Year: 2014).*

Primary Examiner — Z. Jim Yang
(74) Attorney, Agent, or Firm — Bradley Arant Boult Cummings LLP; Henry B. Ward, III

(57) ABSTRACT

Provided herein is a film and methods of producing the same. The film includes a substrate and a layer adjacent to the substrate, wherein a surface of the layer comprises spaced apart protrusions. The methods include providing a substrate, depositing a layer on at least a portion of the substrate, decomposing the layer to form at least a first phase of material and a second phase of material, and removing at least a portion of the second phase from the decomposed layer to form a structured layer.

18 Claims, 13 Drawing Sheets

(51) Int. Cl.
  *B05D 3/14* (2006.01)
  *C03C 11/00* (2006.01)
  *C03C 17/30* (2006.01)
  *C09D 4/00* (2006.01)
  *C23C 14/10* (2006.01)
  *C23C 14/58* (2006.01)
  *G02B 1/18* (2015.01)
(52) U.S. Cl.
  CPC ............... *G02B 1/118* (2013.01); *G02B 1/18* (2015.01); *C03C 2217/76* (2013.01); *Y10T 428/24364* (2015.01)

(56) References Cited

U.S. PATENT DOCUMENTS

| | | | | |
|---|---|---|---|---|
| 2013/0136928 A1* | 5/2013 | Yamane | ............... | C09D 183/12 428/421 |
| 2013/0157008 A1* | 6/2013 | Aytug | ............... | C09D 5/00 428/141 |
| 2013/0194670 A1* | 8/2013 | Liang | ............... | C03C 17/007 359/601 |
| 2013/0323466 A1* | 12/2013 | Baca | ............... | C03C 17/245 428/141 |
| 2014/0320728 A1* | 10/2014 | Sugiyama | ............... | B32B 17/00 348/340 |
| 2015/0103406 A1* | 4/2015 | Takashima | ............... | C03C 8/16 65/17.2 |
| 2015/0107582 A1* | 4/2015 | Jin | ............... | G02B 5/208 428/206 |
| 2015/0239773 A1* | 8/2015 | Aytug | ............... | C03C 17/008 204/192.12 |
| 2015/0275035 A1* | 10/2015 | Yamane | ............... | C03C 17/30 428/447 |
| 2015/0322270 A1* | 11/2015 | Amin | ............... | C03C 21/002 428/141 |
| 2015/0338552 A1* | 11/2015 | Fujii | ............... | G02B 1/18 359/601 |
| 2016/0040039 A1* | 2/2016 | Yamane | ............... | C08G 65/007 524/588 |
| 2016/0200630 A1* | 7/2016 | Amano | ............... | C23C 18/38 216/87 |
| 2017/0058131 A1* | 3/2017 | Sigmund | ............... | C09D 183/08 |
| 2017/0349785 A1* | 12/2017 | Galvez | ............... | C09D 183/04 |
| 2019/0226113 A1* | 7/2019 | Winn | ............... | C25D 11/246 |
| 2020/0238797 A1* | 7/2020 | Bard | ............... | G02B 1/111 |
| 2020/0310014 A1* | 10/2020 | Bard | ............... | B32B 17/10431 |
| 2020/0333593 A1* | 10/2020 | Bard | ............... | C03B 27/012 |

* cited by examiner

*Fig.* 1

TRANSPARENT SUPERHYDROPHOBIC COMPOSITION

CROSS-REFERENCE TO RELATED APPLICATIONS

This application claims the benefit of priority to U.S. Provisional Serial Application No. 62/880,525 filed Jul. 30, 2019 the contents of which are replied upon and incorporated herein by reference in its entirety.

BRIEF SUMMARY

Provided herein is an embodiment directed to a method for producing a film. The method includes providing a substrate; depositing a layer on at least a portion of the substrate; decomposing the layer to form at least a first phase of material and a second phase of material; and removing at least a portion of the second phase from the decomposed layer to form a structured layer.

In a first aspect of the first embodiment, the step of decomposing the layer comprises subjecting the containing layer to flash lamp annealing.

In a second aspect, alone or in combination with the first aspect of the first embodiment, the method includes creating a temperature gradient based on the flash lamp annealing such that the temperature of the film decreases from an air-layer interface of the film to a substrate-layer interface of the film.

In a third aspect, alone or in combination with any of the previous aspects of the first embodiment, the layer is heated and the substrate is not heated.

In a fourth aspect, alone or in combination with any of the previous aspects of the first embodiment, the decomposed layer comprises a silica rich crust, the method includes removing the silica rich crust prior to removing at least a portion of the second phase.

In a fifth aspect, alone or in combination with any of the previous aspects of the first embodiment, the method includes subjecting the silica crust to a plasma etching process.

In a sixth aspect, alone or in combination with any of the previous aspects of the first embodiment, the method includes applying a hydrophobic silane composition to the structured layer.

In a seventh aspect, alone or in combination with any of the previous aspects of the first embodiment, the hydrophobic silane comprises a molecule of the structure:

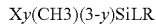

where y is 1 to 3; X is Cl, Br, I, H, HO, R'HN, R'2N, imidizolo, R'C(O)N(H), R'C(O)N(R"), R'O, F3CC(O)N(H), F3CC(O)N(CH3), or F3S(O)2O, where R' is a straight or branched chain hydrocarbon of 1 to 4 carbons and R" is methyl or ethyl; L, a linking group, is CH2CH2, CH2CH2CH2, CH2CH2O, CH2CH2CH2O, CH2CH2C(O), CH2CH2CH2C(O), CH2CH2OCH2, CH2CH2CH2OCH2; and R is (CF2)nCF3 or (CF(CF3)OCF2)nCF2CF3, where n is 0 to 24.

In an eighth aspect, alone or in combination with any of the previous aspects of the first embodiment, the film is transparent, superhydrophobic, or antireflective.

In a ninth aspect, alone or in combination with any of the previous aspects of the first embodiment, the method includes subjecting the containing layer to an oxygen plasma process.

In another embodiment, a film is provided. The film includes a substrate comprising an inert material and a layer adjacent to the substrate, wherein a surface of the layer comprises spaced apart protrusions.

In a first aspect of the second embodiment, the film includes a superhydrophoic layer positioned adjacent to the spaced apart protrusions.

In a second aspect, alone or in combination with the first aspect of the second embodiment, the superhydrophoic layer comprises a hydrophobic silane comprises a molecule of the structure:

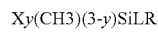

where y is 1 to 3; X is Cl, Br, I, H, HO, R'HN, R'2N, imidizolo, R'C(O)N(H), R'C(O)N(R"), R'O, F3CC(O)N(H), F3CC(O)N(CH3), or F3S(O)2O, where R' is a straight or branched chain hydrocarbon of 1 to 4 carbons and R" is methyl or ethyl; L, a linking group, is CH2CH2, CH2CH2CH2, CH2CH2O, CH2CH2CH2O, CH2CH2C(O), CH2CH2CH2C(O), CH2CH2OCH2, CH2CH2CH2OCH2; and R is (CF2)nCF3 or (CF(CF3)OCF2)nCF2CF3, where n is 0 to 24.

In a third aspect, alone or in combination with any of the previous aspects of the second embodiment, the hydrophobic silane comprises 1H,1H,2H,2H-perfluorooctyltrichlorosilane In still another embodiment, a film is provided. The film includes a substrate, the substrate comprising chemically reactive surface; a silane-containing layer chemically bonded to the surface of the substrate; where the silane-containing layer comprises spaced apart protrusions; where the film is superhydrophobic and transparent.

BRIEF DESCRIPTION OF THE SEVERAL VIEWS OF THE DRAWINGS

The present embodiments are further described in the detailed description which follows in reference to the noted plurality of drawings by way of non-limiting examples of the present embodiments in which like reference numerals represent similar parts throughout the several views of the drawings and wherein.

DETAILED DESCRIPTION

Figure 1:
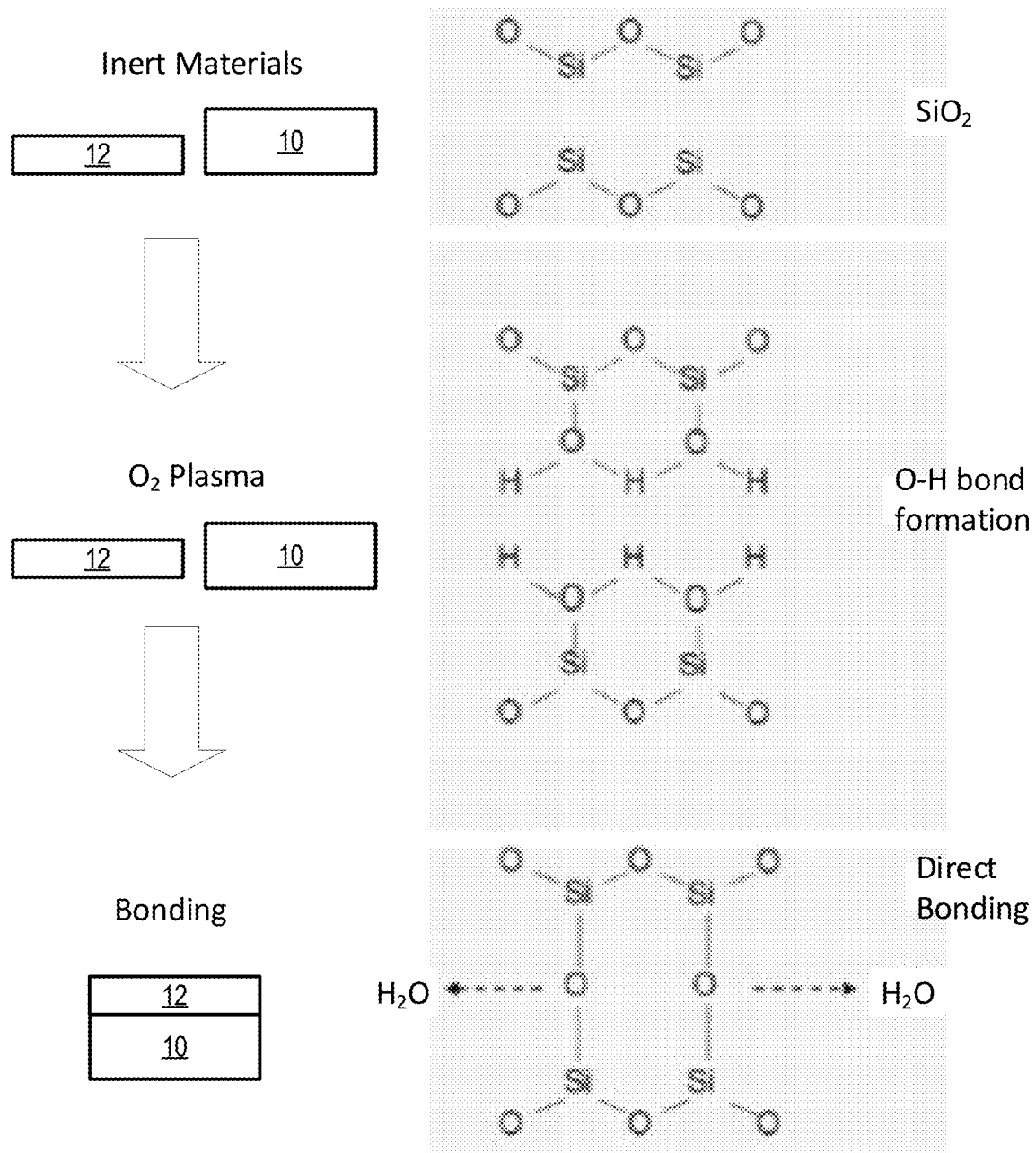
FIG. 1 illustrates a process for making a transparent composition in accordance with various embodiments.

The embodiments of the disclosure presented herein are directed to superhydrophobic compositions and methods of making the same. The superhydrophobic composition, in some embodiments, is transparent, antireflective, and durable. The superhydrophobic composition comprises films, domes, discs, panes, multilayer structures, or single layer structures. In some embodiments the superhydrophobic composition includes a film or other structure that includes a substrate and a top layer adjacent to the substrate. The top layer, in some embodiments, is attached to the substrate via sputtering or other deposition processes. Various techniques may be utilized to treat the substrate and/or top layer before, during, or after sputtering to enhance the properties of the superhydrophobic material.

Hydrophobic surfaces bind very weakly with water, which makes drops of water form beads on the surface. A hydrophobic surface is defined herein as a surface having a contact angle greater than 90° with a drop of water. A super-hydrophobic surface is defined herein as surfaces having a contact angle greater than 150° with a drop of water at normal ambient temperatures (about 25° C.).

Although the film is described in terms of superhydrophobicity, optical transparency, anti-reflectivity, and durability, it will be understood that any number of other properties or functionalities may also be attributable to the film. For example, other properties may include abrasion resistance, scratch resistance, "sand drop," adhesion, ice-phobicity, and the like.

The film can be superhydrophilic instead of superhydrophobic. Instead of functionalizing with hydrophobic chemistry, hydrophilic chemistry may be added or the film may be kept "as is" to enable anti-fogging properties and water absorption. In cases where the film is superhydrophobic, the porous superhydrophobic film can be filled (like a sponge) with a perfluorinated oil or otherwise hydrophobic oil in order to create an omniphobic, low coefficient friction, and low-roll-off-for-all-fluids coating. Such films can be used as an anti-icing, oil-shedding coating for windows and other structures. In other cases, selected areas of the film can be masked to create superhydrophobic tracks along with hydrophilic tracks for fluid transport applications.

As used herein, "transparent" refers to a material or layer that transmits rays of visible light in such a way that the human eye may see through the glass distinctly. One definition of optically transparent is a maximum of 50% attenuation at a wavelength of 550 nm (green light) for a material or layer, e.g., a layer 1 μm thick. Another definition can be based on the Strehl Ratio, which ranges from 0 to 1, with 1 being a perfectly transparent material. Exemplary optically transparent materials can have a Strehl Ratio≥0.5, or a Strehl Ratio≥0.6, or a Strehl Ratio≥0.7, or a Strehl Ratio≥0.8, or a Strehl Ratio≥0.9, or a Strehl Ratio≥0.95, or a Strehl Ratio≥0.975, or a Strehl Ratio≥0.99.

The thickness of the superhydrophoic composition ranges from about 100 nm to about 10,000 nm.

The substrate is formed from silicate compounds, polymers, or other optical or transparent materials. For example, the substrate may comprise quartz. Other exemplary substrate materials include silicon, soda lime glass, germanium arsenide, various crystalline and polycrystalline materials such as zinc sulfide, aluminum oxynitride, aluminum oxide (sapphire), and zirconium dioxide, various polymers such as acrylics, acrylic copolymers, polystyrene, polycarbonate, methylpentene, cyclic olefins, styrene acrylonitrile, polyetherimide (PEI), polyethersulfone (PES), and combinations thereof.

Bonded to the substrate or otherwise positioned adjacent to the substrate is at least one top layer. Although the films described herein include a top layer adjacent to one surface of the substrate, it will be understood that the top layer can be applied to more than one side of the substrate. For example, the top layer may be applied to the top, bottom, and side surfaces (i.e., major and minor surfaces) of the substrate.

Figure 8:
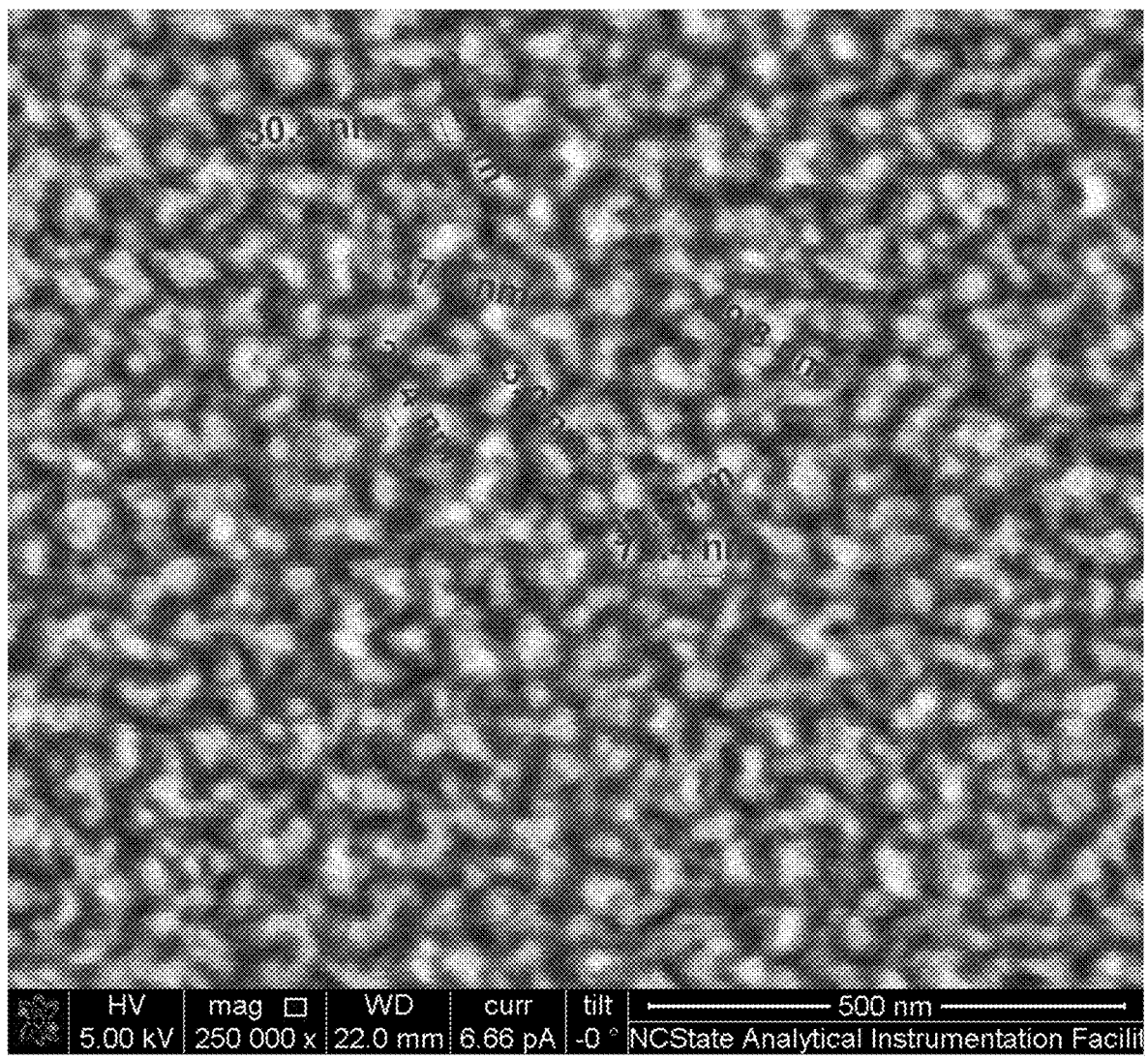
FIG. 8 illustrates a Scanning Electron Microscopy (SEM) image of a substrate and top layer in accordance with various embodiments.

The top layer includes protrusions corresponding to a surface topography comprising peaks and valleys (see, e.g., FIG. 8). The top layer further includes nanopores having a major diameter ranging from 1 to 750 nm. The top layer described herein can have a nanopore size ranging from 10 nm to about 10 μm, or 100 nm to 8 μm, or 500 nm to 6 μm, or 1 to 5 μm, or any combination thereof, e.g., 500 nm to 5 μm.

In further embodiments, an oxygen plasma process is applied to the surface of the substrate prior to depositing a layer onto the substrate. As shown in FIG. 1, a substrate 10 of inert material such as borosilicate glass or quartz and a layer 12 of the same or different inert material is illustrated. The bonding surfaces of the substrate 10 and/or layer 12 may be prepped with a mixture of sulfuric acid and hydrogen peroxide to remove residue from the surfaces. In other embodiments, a Piranha etch using the sulfuric acid and hydrogen peroxide mixture can be used to form hydroxyl bonds instead of the oxygen plasma treatment. Oxygen plasma treatment can then be applied to the cleaned surfaces of the substrate 10 and layer 12 to activate the inert $SiO_2$ surfaces of the substrate 10 and/or layer 12 by formation of OH bonds. Following the oxygen plasma treatment, the substrate 10 and layer 12 can be rinsed with deionized water and dried under nitrogen gas. The process parameters of the oxygen plasma include a power range of about 200 W to about 3000 W, a pressure range from about 1 mTorr to about 80 mTorr, and a duration range of about 1 minute to about 2 hours. The oxygen plasma treatment prepares the surface of the substrate 10 and/or layer 12 for sputtering or additional treatments.

The top layer is formed, bonded, or otherwise attached to the substrate using sputtering, pulsed laser ablation, chemical vapor deposition (CVD), metallorganic chemical vapor deposition (MOCVD), and e-beam co-evaporation. Additionally or alternately, a layer can be deposited onto the substrate using chemical solution processes or deposition of a halogen compound for an ex situ film process, followed by a heat treatment.

In some embodiments, the top layer is formed by sputtering a material onto at least a portion of the substrate. The sputter target can include sintered borosilicate glass composed of approximately 65 wt % $SiO_2$, 26 wt % $B_2O_3$, and 9 wt % $Na_2O$ or various other composite materials which can separate into two immiscible phases such as aluminum and aluminum oxide, nickel oxide and aluminum, aluminum oxide and bismuth, aluminum nitride and bismuth, aluminum oxide and magnesium oxide, titanium oxide and copper oxide, and combinations thereof. In such embodiments, ground borosilicate glass powder is pressed into a mold and sintered into a ceramic disk or other configuration to form the sputter target. The boron oxide and silicon oxide content of the sputter target can vary. In one exemplary embodiment, the sputter target includes 50 wt % $SiO_2$, 40 wt % $B_2O_3$, and 10 wt % $Na_2O$. In other cases, the boron oxide content may be as high as 80 wt % of the sputter target. In still other cases, the silicon oxide wt % content level may be higher (e.g., 81 wt % $SiO_2$, 13 wt % $B_2O_3$, 4 wt % $Na_2O$, 2 wt % $Al_2O_3$). In cases of high silicon oxide content, higher heating temperatures may be required than a sputter target that include high levels of boron oxide and lower levels of silicon oxide.

Top layers made from sputtering the sintered sputter target are as capable of becoming superhydrophobic as other materials such as molten cast glass. Further, the manufacture of the sintered sputter glass is easier and less costly than the process required for molten glass, which often requires custom made platinum or graphite molds.

In additional or alternative embodiments, the substrate is charged during sputtering. A pulse DC (direct current) signal is imposed on or behind the substrate to be coated while the sputter target has a radio frequency (RF) signal. Alternatively, a magnetic field can be imposed to accelerate ions into the substrate in the same manner such as with a magnetron. This increases the rate of deposition onto the substrate, increase adhesion of the layer to the substrate, and change the morphology of the layer as it is being deposited thus bypassing the need for a heat treatment phase separation. This is because the substrate is typically grounded to the chamber and thus neutrally charged, but a net charge can be applied to the substrate by using a separate DC signal to cause the sputtered ions to be actively drawn to the substrate's surface.

In additional or alternative embodiments, a molten-cast borosilicate glass can be used to create a single-component superhydrophobic material having a top surface that has been processed. In such embodiments, a portion (e.g., the top surface) of the molten-cast borosilicate is subjected to phase-separation by heating or flash annealing. The phase-separated portion is then subjected to a plasma etch to remove the silica crust formed during heating. The plasma etched portion can undergo an acid etch to remove the boron-rich phase throughout the phase-separated portion of the borosilicate. In cases where flash annealing is used, only a certain portion of the borosilicate substrate is subjected to heat and undergoes phase-separation. The acid etched portion can then be treated with oxygen plasma and treated with a hydrophobic silane to make the borosilicate optic superhydrophobic. In cases where the borosilicate optic undergoes furnace heating, silane bulk treatment may be employed. Further details regarding phase-separation, plasma etching, acid etching, and silane treatments are discussed below.

Phase-Separation

After a layer is deposited on the substrate, the deposited layer is heated to cause phase separation. The deposited layer undergoes spinodal decomposition resulting in a phase-separated layer comprising a boron rich phase and a silicon rich phase. Materials such as borosilicate glass require temperatures at about 700° C. to achieve phase separation. The temperature used to cause phase separation of the deposited film ranges from about 580° C. to about 1200° C. The heating duration of the film can range from about 5 minutes to about 100 hours under vacuum, ambient conditions, or inert gas flow. In some embodiments, the entire sample is placed into a preheated oven. Furnace heating may severely limit the applicable substrates to which the layer can be applied. In some cases, the film is not subject to furnace heating.

In additional or alternative embodiments, the film is subjected to flash annealing using high power xenon strobe lamps or similar technology (e.g., laser annealing and neon, krypton, argon, or radon lamps) to achieve the high thermal load necessary for phase separation of the top layer while minimizing the temperature of the substrate. Materials requiring high temperatures for phase-separation may be applied to materials that require low processing temperatures. As such, many different types of substrates can be used including cheaper alternatives such as polycarbonate to high quality optics such as quartz. Moreover, flash lamp annealing enables thick film to be used because heat treatment is very gradual while furnace heated films over 1 micron have too much compressive strength to maintain adhesion. Thick films allow for redundant durability because as the raised surface topography is removed by wear, more topography is exposed.

Flash lamp annealing enables controlled phase-separation at varying depths. For example, in some heating profiles, temperatures may peak at the surface of the film and decrease as depth of film increases such that the layer of the film is subject to high temperatures while the substrate is subject to lower temperatures. Using pulse configurations, flash lamp annealing creates the optimal temperature and time necessary for phase-separation. Different pulse configurations can be used to vary the results of the heat treatment. Different heat treatments create different phase separation results. For example, high heat results in large silicon oxide features while lower heat results in smaller silicon oxide features.

Figure 10:
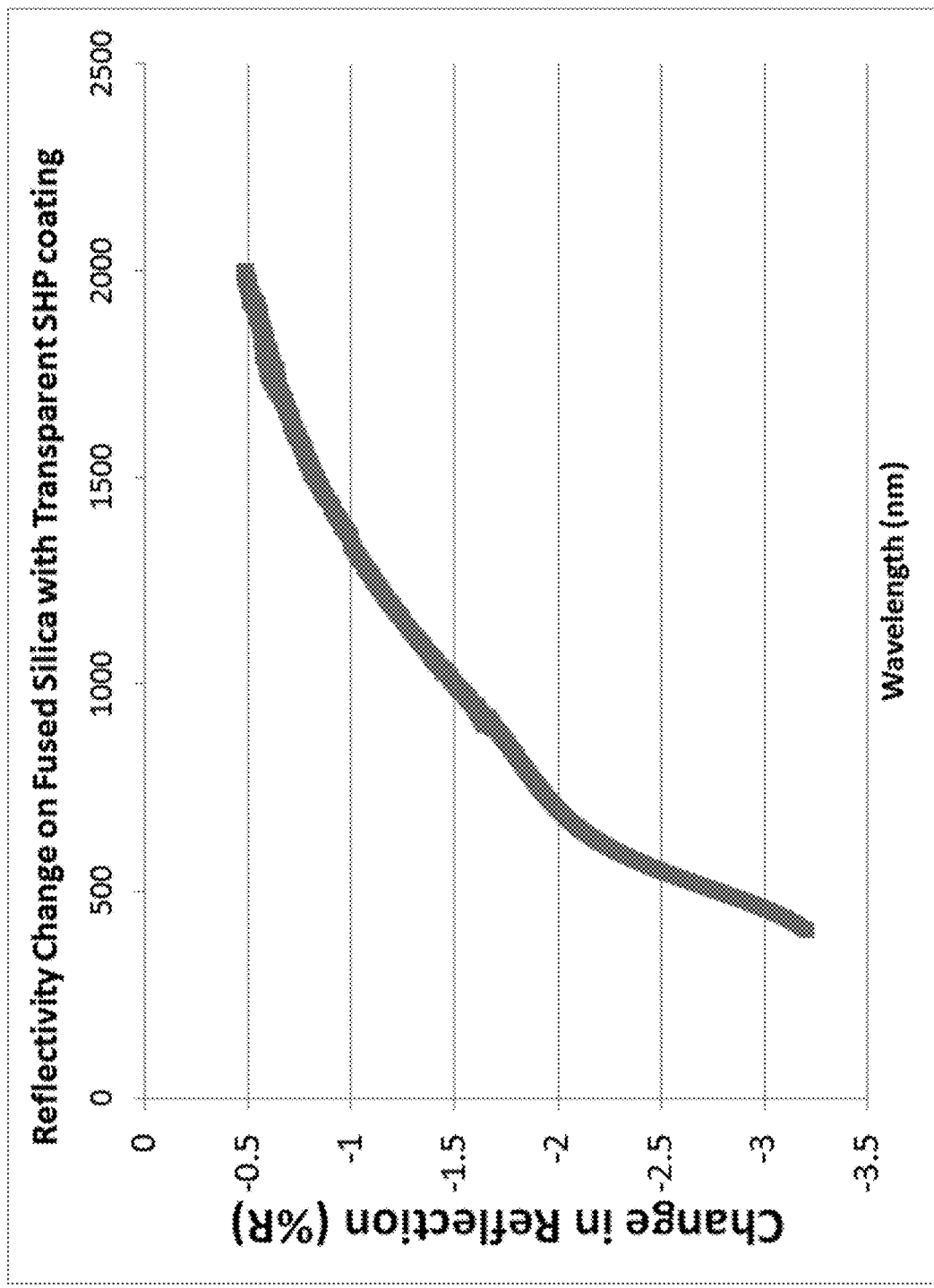
FIG. 10 is a graph illustrating reflectivity change of a substrate and top layer in accordance with various embodiments.
Figure 11:
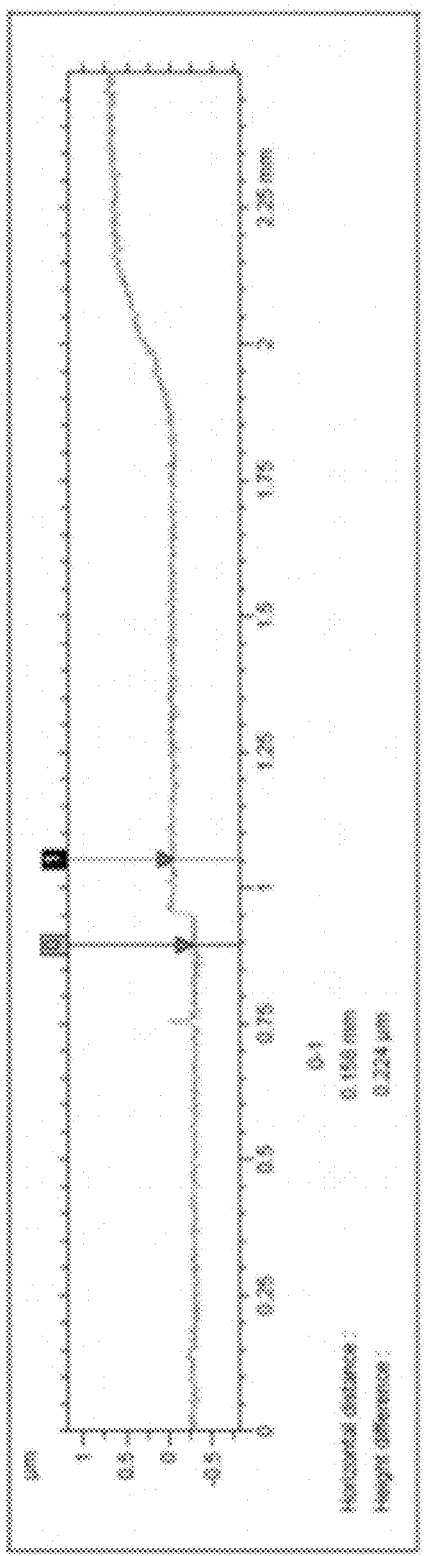
FIG. 11 is a profilometer graph indicating etching depth in accordance with various embodiments.
Figure 12:
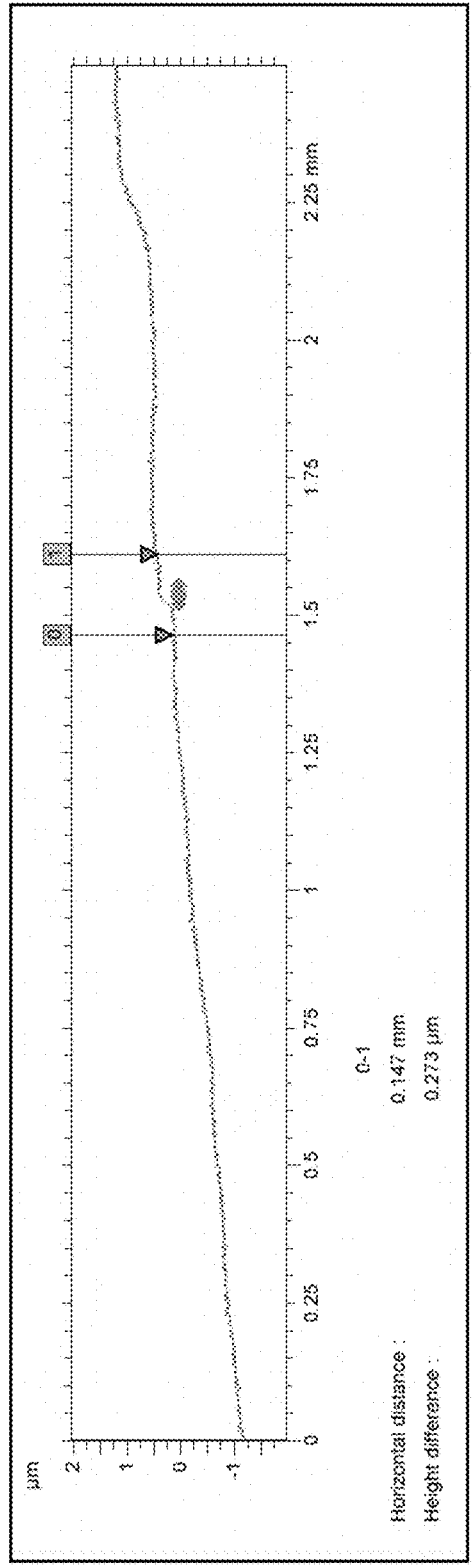
FIG. 12 is a profilometer graph indicating etching depth in accordance with various embodiments.
Figure 13:
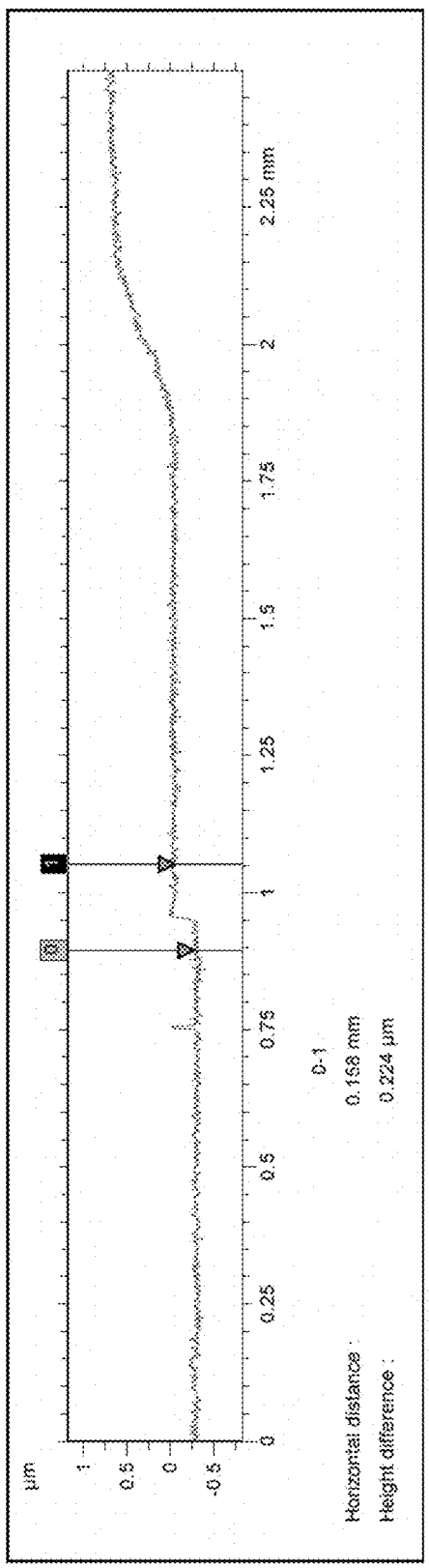
FIG. 13 is a profilometer graph indicating etching depth in accordance with various embodiments.
Figure 14:
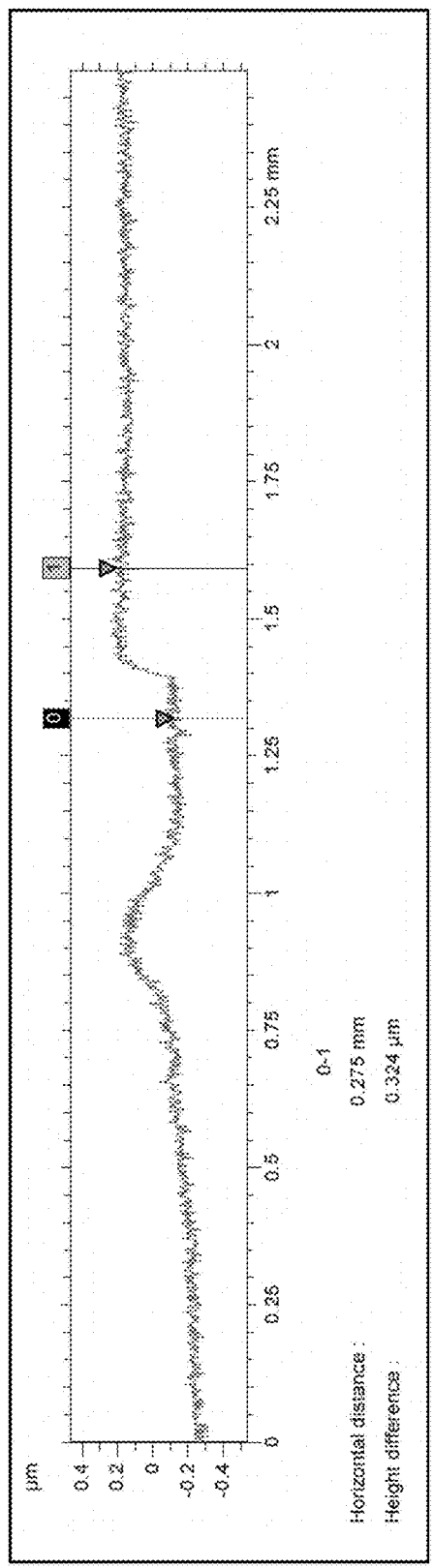
FIG. 14 is a profilometer graph indicating etching depth in accordance with various embodiments.
Figure 15:
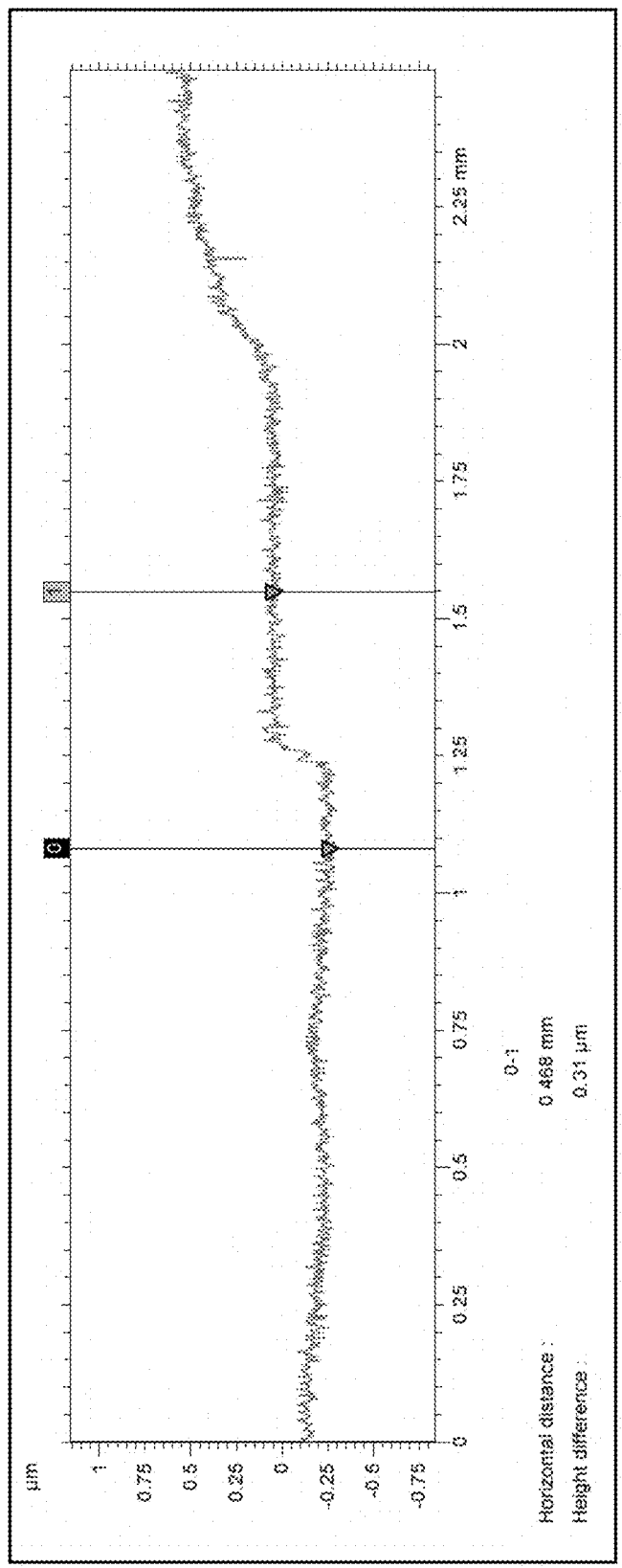
FIG. 15 is a profilometer graph indicating etching depth in accordance with various embodiments.

Flash lamp annealing can also be used to create a gradient heat treatment of the two-phase layer and thus develop a gradient anti-reflective layer. This method can give rise to highly tunable feature sizes within a borosilicate film because the phase separation is dependent on the heating duration of the film and the temperature at which the film is heated. FIG. 10 is a graph illustrating reflectivity change of a substrate and top layer.

Following heated phase separation, the coating can be etched with acid to remove the boron oxide phase. Boron oxide can only be etched by non-fluoric acids after it has been removed from silicon oxide materials, so this phase-leech step is self-limiting. That is, borosilicate glass itself is largely inert to acids that normally react with boron oxide such as hydrochloric and nitric acid.

Further, increasing heat results in larger phases. For example, a borosilicate material heated in a furnace for three hours at 580° C. will exhibit surface microstructures indicative of phase-separation. Borosilicate glass heated at higher temperatures, for example 650° C. for three hours, may exhibit larger and more elevated microstructures indicative even greater phase-separation than samples heated at a lower temperature. In the 650° C. example, the silica phase is raised and smooth while the boron oxide phase has a rough surface. The higher temperature, the larger the elevated microstructure indicating further coalescence of the silica-rich phase in an interconnected network. Moreover, a material that has higher boron oxide content can be used to facilitate phase separation at lower temperatures and processing times.

As noted above, flash annealing can be used to perform controlled heat treatment on only the surface of a material. It can be used to vary the depth of a given heat treatment through different exposure conditions, and in this manner can lead to a borosilicate film with large features at the top (high heat treatment) and gradually decreased feature size (lower heat treatment) until reaching the substrate or otherwise dropping below the phase separation threshold.

Because a high-boron oxide borosilicate material can give rise to different phase separation profiles at certain heat treatment levels, and because flash lamp annealing can be used to expose a thin film to a gradient heat treatment, flash lamp annealing can be used to cause a gradient phase separation of borosilicate materials. These gradient phase separated coatings can then be acid etched by conventional acids in a self-limiting reaction that is much more repeatable than purely by acid exposure timing methods. In acid exposure timing methods; a multilayer film is placed in a heated furnace to induce a complete phase separation throughout the borosilicate film. Following removal of the silica crust, the film is acid etched in a controlled manner. The acid begins to etch from the top surface of the film and works its way down through the top layer. The reaction is stopped after a certain amount of time in order to prevent full etching.

In cases where a silica-rich crust forms after heat treatment, the film can be etched in a controlled manner by fluorinated plasma prior to acid etching as described below.

Fluorinated Plasma Etch of Phase-Separation Crust

Figure 2:
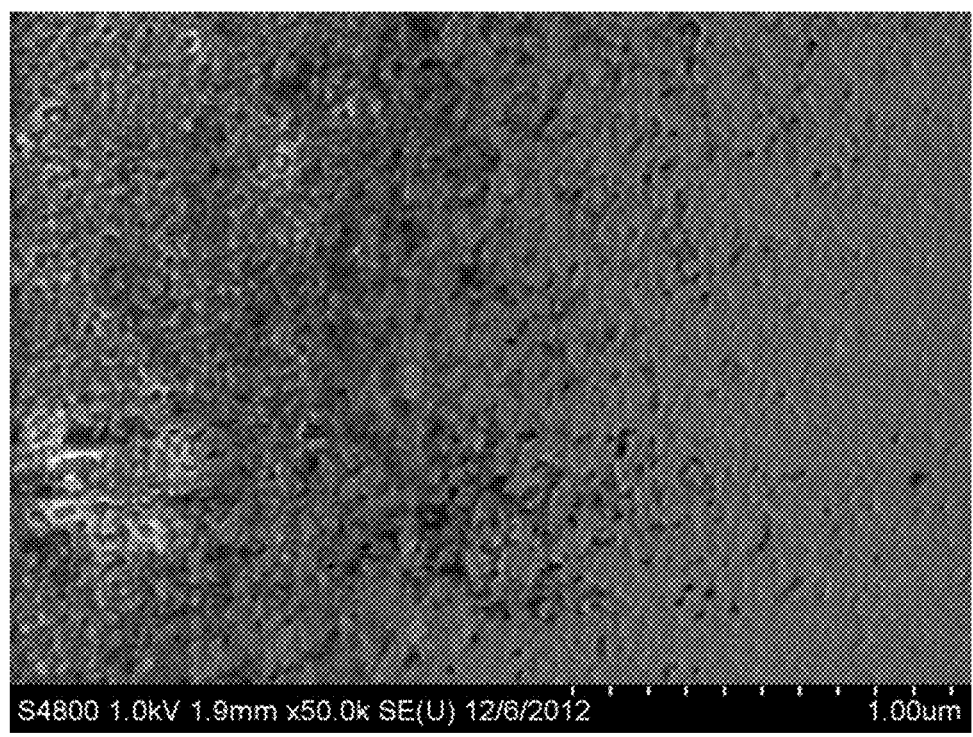
FIG. 2 illustrates a Scanning Electron Microscopy (SEM) image of a film having a silica crust formed thereon in accordance with various embodiments.
Figure 3:
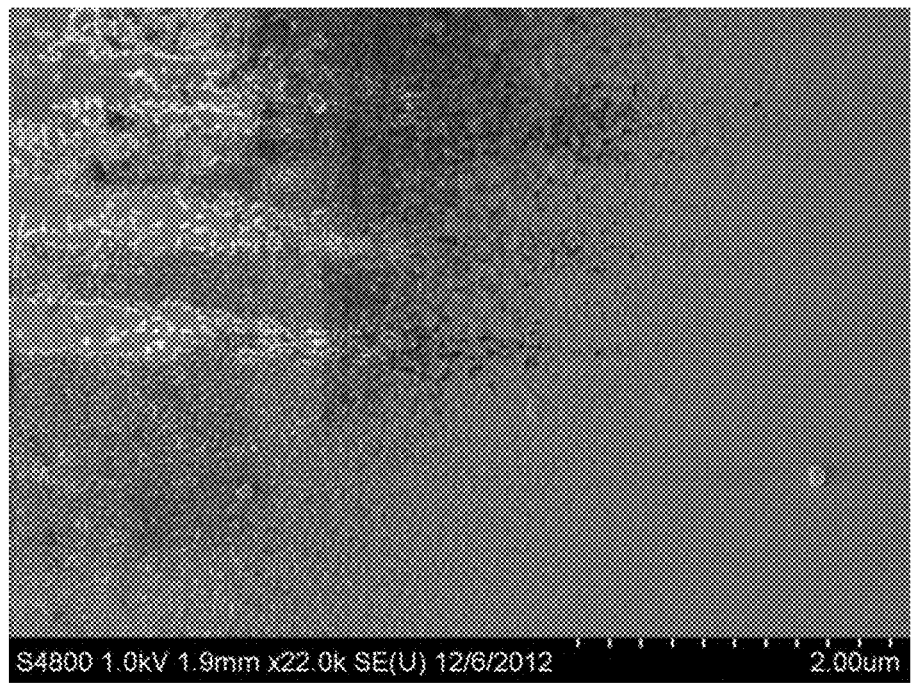
FIG. 3 illustrates a Scanning Electron Microscopy (SEM) image of a film having a silica crust formed thereon in accordance with various embodiments.
Figure 4:
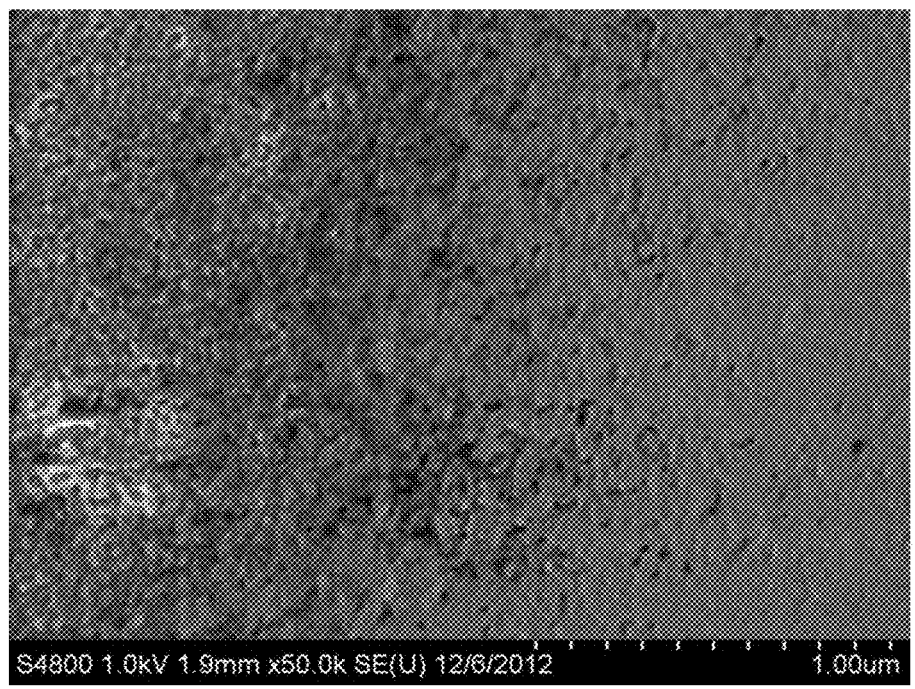
FIG. 4 illustrates a Scanning Electron Microscopy (SEM) image of a film having a silica crust formed thereon in accordance with various embodiments.

During heat treatment for separating boron and silica rich phases, a silica rich crust forms on the surface of the film. FIGS. 2-4 are SEM images of some exemplary silica crusts formed on the top layer of the film. This silica rich crust must be removed in order to expose the phase-separated material and create a superhydrophobic material.

In some embodiments, a hydrofluoric acid (HF) etch may be performed to remove the silica crust and selectively etch the phase-separated material. Pinholes or other imperfections may form in the silica crust. In some cases, the HF may seep down through the crust via the pinholes and cause the crust and film to delaminate thus destroying the film. The HF etch may lead to inconsistent and destructive results. Varying the concentration of the HF and time the crust is exposed to the acid may help alleviate these issues.

In additional or alternative embodiments, a plasma assisted chemical vapor deposition (PACVD) etch using hexafluoroethane ($C_2F_6$) or other fluorine containing gases is utilized to achieve uniform etching of the phase separated layer. Exemplary fluorine containing gases include fluorine ($F_2$), nitrogen trifluoride ($NF_3$), sulfur hexafluoride ($SF_6$), and carbon/fluorine containing gases, such as fluorocarbons, for example octofluorotetrahydrofuran ($C_4F_8O$), carbonyl fluoride ($COF_2$), tetrafluoromethane ($CF_4$), perfluoropropane ($C_3F_8$), and combinations thereof. Additionally or alternatively, inert gases may be used in the plasma etch such as argon, helium, nitrogen, xenon, or otherwise more traditional sputtering gases. Inert gas plasma etch is slower than fluorinated plasma etch and is often referred to as ion-milling. Fluorinated plasma takes minutes while argon milling takes hours to accomplish the same amount of etching. The process parameters of the plasma etch include a power range of about 200 W to about 3000 W and a duration range of 1 minute to about 45 minutes or longer depending on the type of gas used.

Heat treated coated materials are etched down about 100 nm to eliminate the silica crust and expose underlying phase separated material. In other embodiments, 60 nm etching to 250 nm etching can be accomplished via the plasma etch. The etching depth can range from about 5% of the thickness of the entire film (i.e., the substrate and the top layer) to about 95% of the thickness of the entire film. For example, an 875 nm film was etched down 66 nm and a 140 nm film was etched down 100 nm.

The PACVD etch is much safer than the hydrofluoric acid etch and leads to very consistent results. Using the plasma etch treatment before an acid etch alleviates the significant safety concerns associated with hydrofluoric acid because less toxic acids such as hydrochloric acid, nitric acid, and sulfuric acid can be used for selective etching of one phase (e.g., boron oxide). Moreover, safety concerns with non-hydrofluoric acid can also be addressed in still further embodiments. For example, in some embodiments, the boron oxide phase is water soluble following the plasma etch. In such cases, water can be used to leach out the boron oxide. The process parameter of acid etching can include acid temperatures ranging from about 25° C. to about 100° C., acid etch durations ranging from about 30 seconds to about 100 hours or from about 5 minutes to about 120 minutes, and acid concentrations ranging from about 0M for deionized water, 12.1M or less for hydrochloric acid, 15.9M or less for nitric acid, and 18.0M or less for sulfuric acid.

Figure 5:
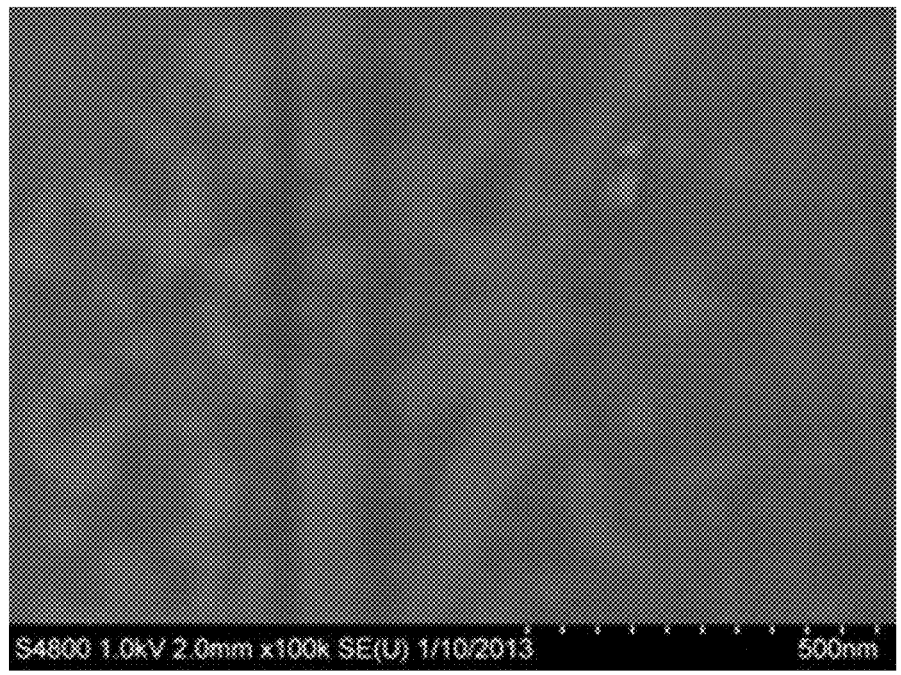
FIG. 5 illustrates a Scanning Electron Microscopy (SEM) image of a silica crust formed on phase-separated layer and substrate after heat treatment in accordance with various embodiments.
Figure 6:
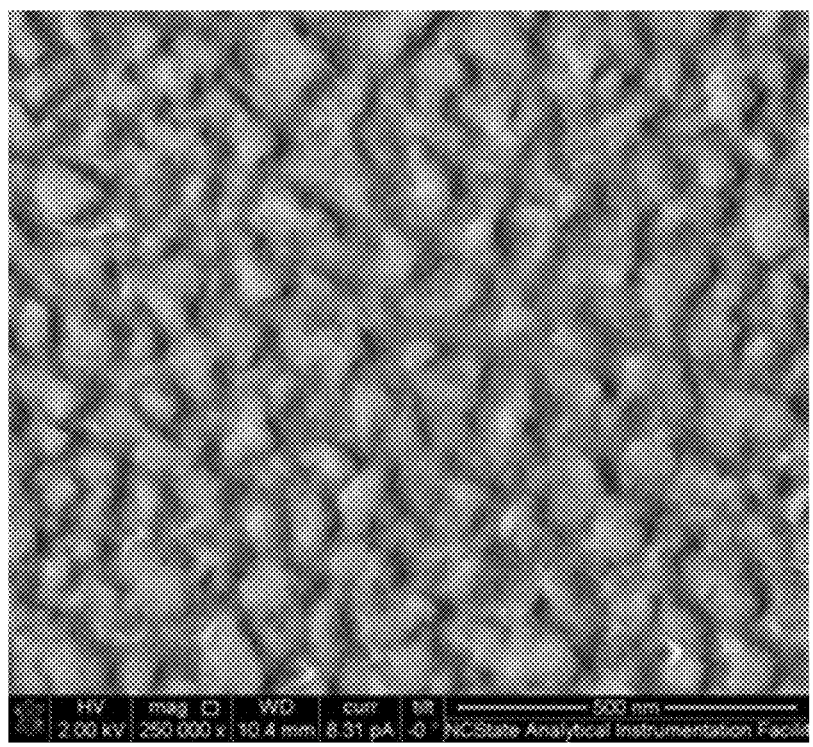
FIG. 6 illustrates a Scanning Electron Microscopy (SEM) image of a substrate and phase-separated layer after plasma etch and before acid etch in accordance with various embodiments.

Samples that are etched with a non-fluoric acid without plasma etching are featureless due to the crust. FIG. 5 is a SEM image illustrating a featureless top layer that was non-fluoridic acid etched but not plasma etched. FIG. 6 is a SEM image illustrating a phase separated, plasma etched boron oxide/silicon oxide top layer.

Once the top layer's crust has been plasma etched away, many different acids can be used to rapidly leach the boron oxide phase which would otherwise be masked by the silica crust. The use of fluorine plasma minimizes the risk of exposing the underlying substrate to hydrofluoric acid (buffered or dilute). For example, quartz and polycarbonate are very susceptible to fluorinated acids, but neither is affected by low concentration hydrochloric or nitric acid.

Figure 7A:
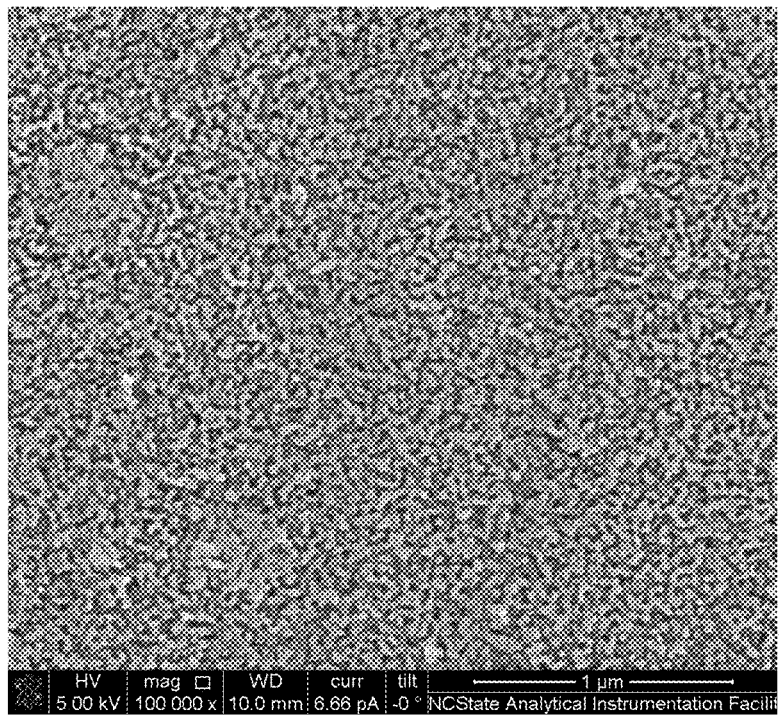
FIG. 7A illustrates a Scanning Electron Microscopy (SEM) image of a substrate and top layer after plasma etch and after acid etch in accordance with various embodiments.
Figure 7B:
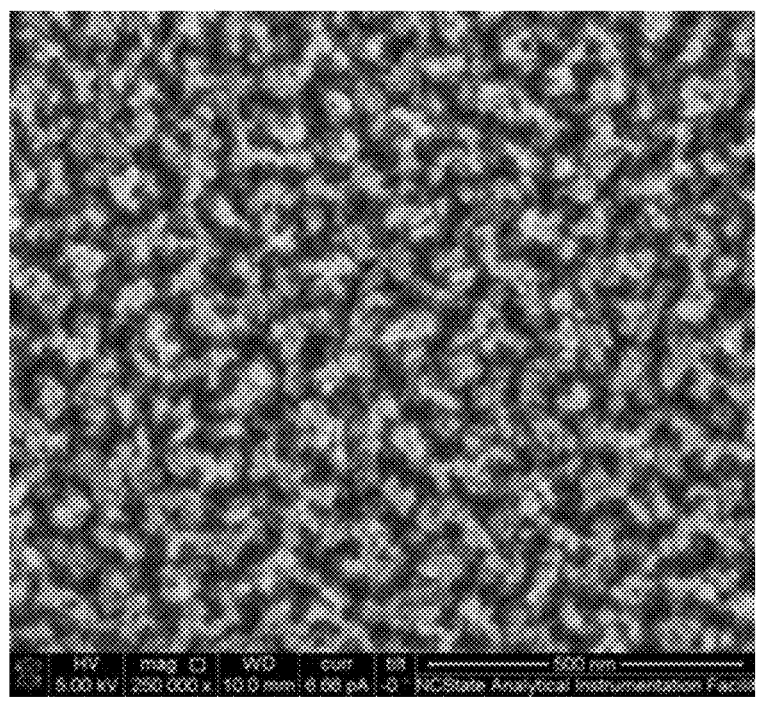
FIG. 7B illustrates a Scanning Electron Microscopy (SEM) image of a substrate and top layer after plasma etch and after acid etch in accordance with various embodiments.

FIGS. 7A-7B are SEM images of varying magnification illustrating the same layer in FIG. 6 after acid etching with hydrochloric acid (HCl). FIG. 7A shows the surface of the layer having a 100,000× magnification and FIG. 7B shows the layer surface at a 250,000× magnification. As shown in FIGS. 7A-7B, the boron rich phase has been removed revealing protrusions and nanoscale branched networks. As shown in FIG. 8, the length of the protruding features of the top layer can range from, for example, about 20 nm to about 80 nm.

Figure 9A:
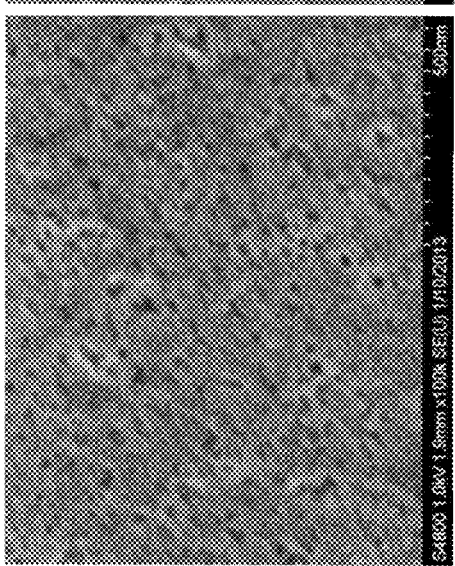
FIGS. 9A-9F illustrate Scanning Electron Microscopy (SEM) images of films exposed to varying heating durations and acid etching durations in accordance with various embodiments.
Figure 9B:
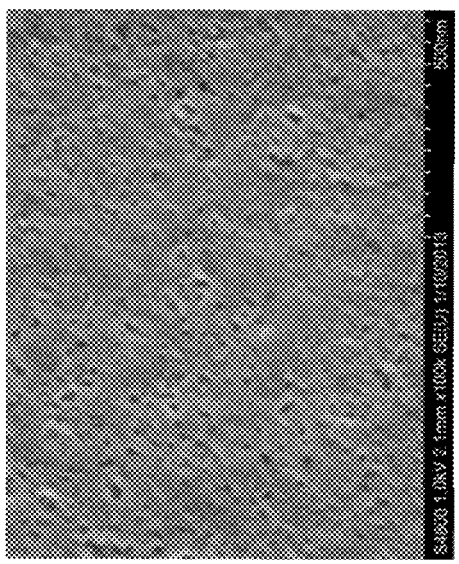
Figure 9C:
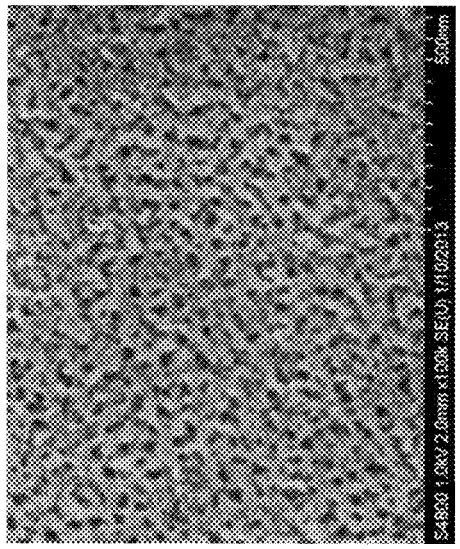
Figure 9D:
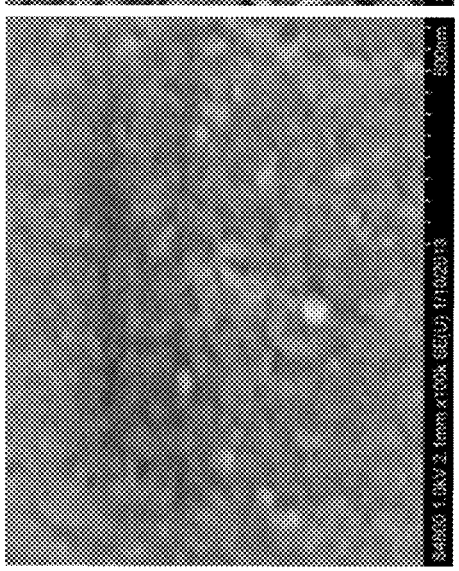
Figure 9E:
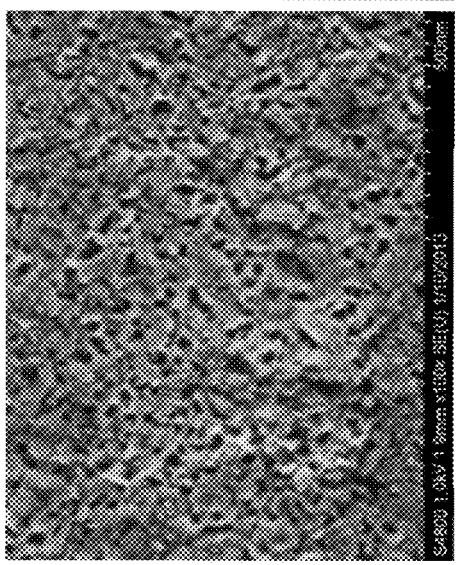
Figure 9F:
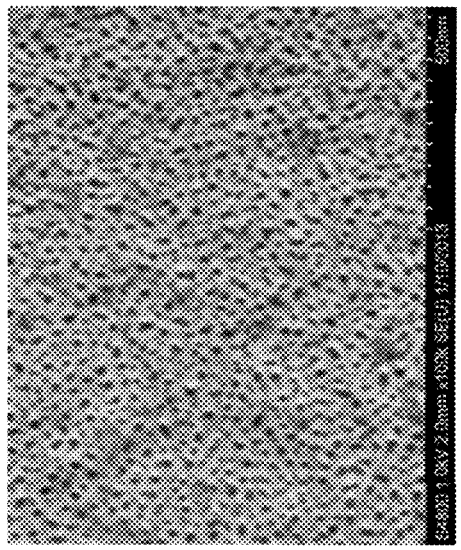

FIGS. 9A-9F are SEM images of etched top layers at varying phase-separation temperature durations and varying etching durations. The top layer samples in FIGS. 9A-9F comprise the same materials. FIG. 9A is an exemplary top layer formed from a deposited layer heated for 5 minutes at 650° C. and acid etched with 3M HCl for 2 hours. FIG. 9B is an exemplary top layer formed from a deposited layer heated for 15 minutes at 650° C. and acid etched with 3M HCl for 2 hours. FIG. 9C is an exemplary top layer formed from a deposited layer heated for 45 minutes at 650° C. and acid etched with 3M HCl for 2 hours. FIG. 9D is an exemplary top layer formed from a deposited layer heated for 5 minutes at 650° C. and acid etched with 3M HCl for 30 minutes. FIG. 9E is an exemplary top layer formed from a deposited layer heated for 15 minutes at 650° C. and acid etched with 3M HCl for 30 minutes. FIG. 9F is an exemplary top layer formed from a deposited layer heated for 45 minutes at 650° C. and acid etched with 3M HCl for 30 minutes.

Superhydrophobic Treatment

In some cases, the etched top layer itself is superhydrophobic. In other cases, the top layer can be made superhydrophobic or the hydrophobicity of the top layer can be enhanced by application of a superhydrophobic coating. In one exemplary treatment, a fluorinated silane solution may be applied to the etched top layer to create a hydrophobic monolayer on the surface of the film. Accordingly, one method of making the film superhydrophobic would be to apply a continuous hydrophobic coating on a surface of the plurality of spaced apart protrusions of the top layer.

The continuous hydrophobic coating can be a self-assembled monolayer (SAM). In some embodiments, the top layer will be superhydrophobic only after a hydrophobic layer is applied thereto. Prior to application of the hydrophobic layer, the uncoated top layer will generally be hydrophilic. The coating can be a perfluorinated organic material, a self-assembled monolayer, or both.

Self-assembled monolayers (SAMs) are coatings consisting of a single layer of molecules on a surface, such as the surface of the coating. In a SAM, the molecules are arranged in a manner where a head group is directed toward or adhered to the surface, generally by the formation of at least one covalent bond, and a tail group is directed to the air interface to provide desired surface properties, such as hydrophobicity. As the hydrophobic tail group has the lower surface energy it dominates the air-surface interface providing a continuous surface of the tail groups.

Although SAM methods are described, it will be understood that alternate surface treatment techniques can be used. Additional exemplary surface treatment techniques include, but are not limited to, SAM; physical vapor deposition, e.g., sputtering, pulsed laser deposition, e-beam co-evaporation, and molecular beam epitaxy; chemical vapor deposition; and alternate chemical solution techniques.

SAMs can be prepared by adding a melt or solution of the desired SAM precursor onto the surface of the coating where a sufficient concentration of SAM precursor is present to produce a continuous conformal monolayer. After the hydrophobic SAM is formed and fixed to the surface of the coating, any excess precursor can be removed as a volatile or by washing. In this manner the SAM-air interface can be primarily or exclusively dominated by the hydrophobic moiety.

One example of a SAM precursor that can be useful for the compositions and methods described herein is tridecafluoro-1,1,2,2-tetrahydroctyltriclorosilane. In some instances, this molecule undergoes condensation with the silanol groups of the nanostructured layer, which releases HCl and covalently bonds the tridecafluoro-1,1,2,2-tetrahydroctylsilyls group to the silanols at the surface of the porous particle. The tridecafluorohexyl moiety of the tridecafluoro-1,1,2,2-tetrahydroctylsilyl groups attached to the surface of the nanostructured layer provides a monomolecular layer that has a hydrophobicity similar to polytetrafluoroethylene. Thus, such SAMs make it possible to produce a top layer having hydrophobic surfaces while retaining the desired nanostructured morphology that produces the desired superhydrophobic properties.

Exemplary hydrophobic silanes or SAM precursors include a molecule of the structure:

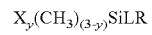

where y is 1 to 3; X is Cl, Br, I, H, HO, R'HN, R'$_2$N, imidazole, R'C(O)N(H), R'C(O)N(R"), R'O, F$_3$CC(O)N(H), F$_3$CC(O)N(CH$_3$), or F$_3$S(O)$_2$O, where R' is a straight or branched chain hydrocarbon of 1 to 4 carbons and R" is methyl or ethyl; L, a linking group, is CH$_2$CH$_2$, CH$_2$CH$_2$CH$_2$, CH$_2$CH$_2$O, CH$_2$CH$_2$CH$_2$O, CH$_2$CH$_2$C(O), CH$_2$CH$_2$CH$_2$C(O), CH$_2$CH$_2$OCH$_2$, CH$_2$CH$_2$CH$_2$OCH$_2$; and R is (CF$_2$)$_n$CF$_3$ or (CF(CF$_3$)OCF$_2$)$_n$CF$_2$CF$_3$, where n is 0 to 24. Exemplary hydrophobic silanes include fluoralkylsilanes (e.g., 1H,1H,2H,2H-perfluorooctyltrimethoxysilane) and alkylsilanes (e.g., octadecyltrichlorosilane).

To enhance the superhydrophobic treatment, the oxygen plasma process discussed hereinabove can be applied to the surface of the etched coating prior to the application of the hydrophobic silane to increase the open bond sites of the SiO$_2$. This increases the chemical reactivity of the inert material and allows chemical bonding between the hydrophobic silane and the top layer.

Examples

Oxygen Plasma Treatment of Substrate:

Quartz substrates were cleaned and then placed in a vacuum chamber with a base pressure of 6×10-6 Torr, and then oxygen plasma treated for 30 minutes with an RF source having a bias of −200V and oxygen partial pressure of 10 mTorr. Following the treatment, samples were immersed in deionized water for 10 minutes and blown dry with nitrogen.

Deposit of Borosilicate Coating onto Treated Glass Dome:

Following the oxygen plasma pretreatment, the samples were inverted over a borosilicate sputter target and the chamber evacuated to 6×10−6 Torr. Sputtering can be performed at a bias between −1000 to −1200V for a sufficient amount of time to deposit a minimum of 500 nm over the entire substrate. Thickness can vary over the sample depending on the distance from the quartz substrate to the sputter target. A curved dome, for example, varies from being 4 inches from the target at the base of the dome, to being 2 inches from the target at the apex of the dome. Typical average deposition rate is 4.5 nm per minute and thus processes run for about 120 minutes.

In some cases, the samples can be subjected to a Pulse DC signal during sputtering in order to increase deposition rate and adhesion.

Phase-Separation of Deposited Coating:

Following borosilicate deposition, the samples were placed in a furnace preheated to 700° C. The samples were treated at 700° C. for 25 minutes and then passively cooled in ambient conditions back to room temperature. Alternatively, as described hereinabove, samples can be treated by flash annealing in order to subject only the sputtered thin film (i.e., the deposited layer) to heat treatment.

Fluorinated Plasma Etch:

The samples were then etched by plasma in order to remove the topical silica crust. Areas where etching is not desired can be masked with materials such as carbon tape, polyimide film (e.g., Kapton® tape), other vacuum stable tapes, photoresist, or aluminum foil. Plasma etching is performed at 0.23 mTorr $C_2F_6$ at 600 W with an RF signal for 20-50 minutes, depending on the desired depth of etching. A minimum of 60 nm, in some embodiments, is etched away. For thick dielectric substances, the cathode is masked with polytetrafluoroethylene (PTFE) or polyoxymethylene (POM) in order achieve acceptable plasma etching. Cavities within the sample can be filled with an electrically conductive material in order to assist in equal charge distribution.

Figure 16:
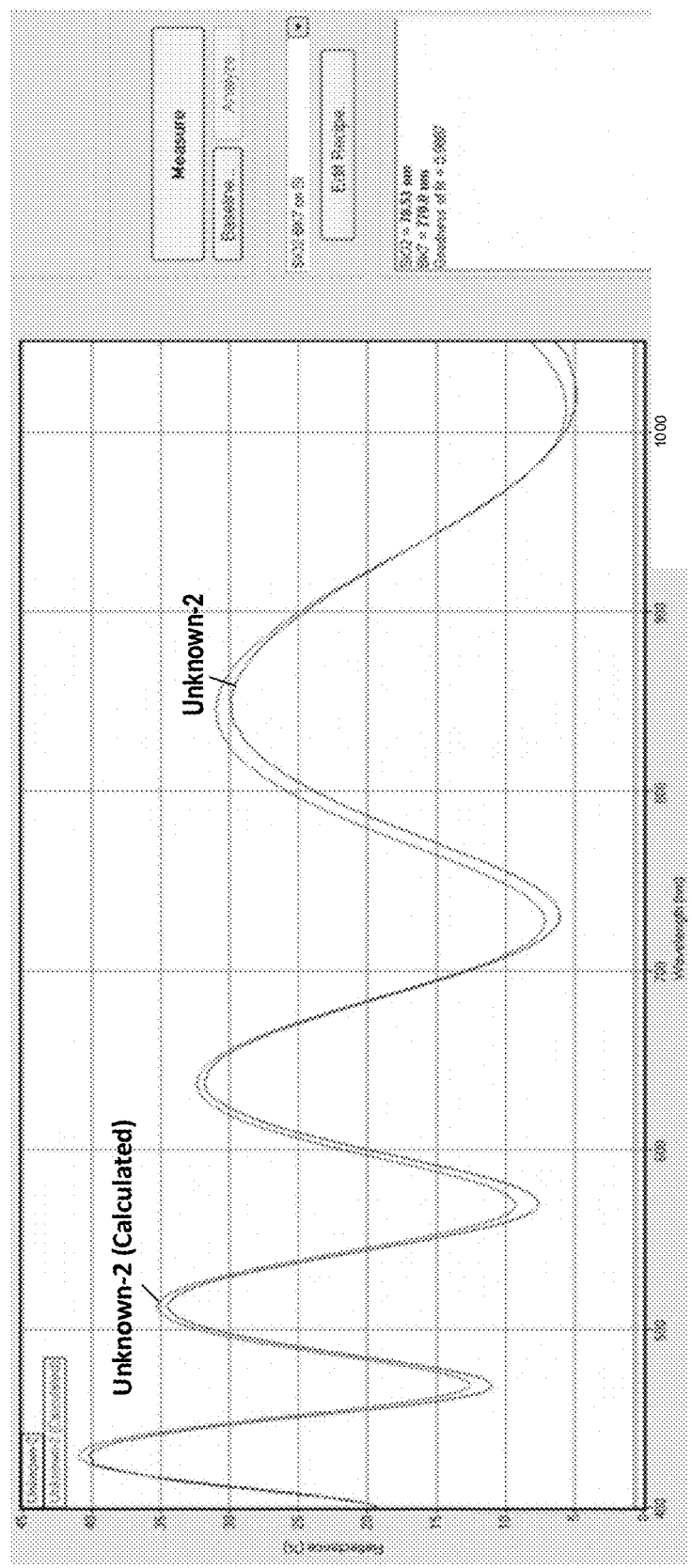
FIG. 16 is a reflectometer graph of a sample before plasma etch in accordance with various embodiments.
Figure 17:
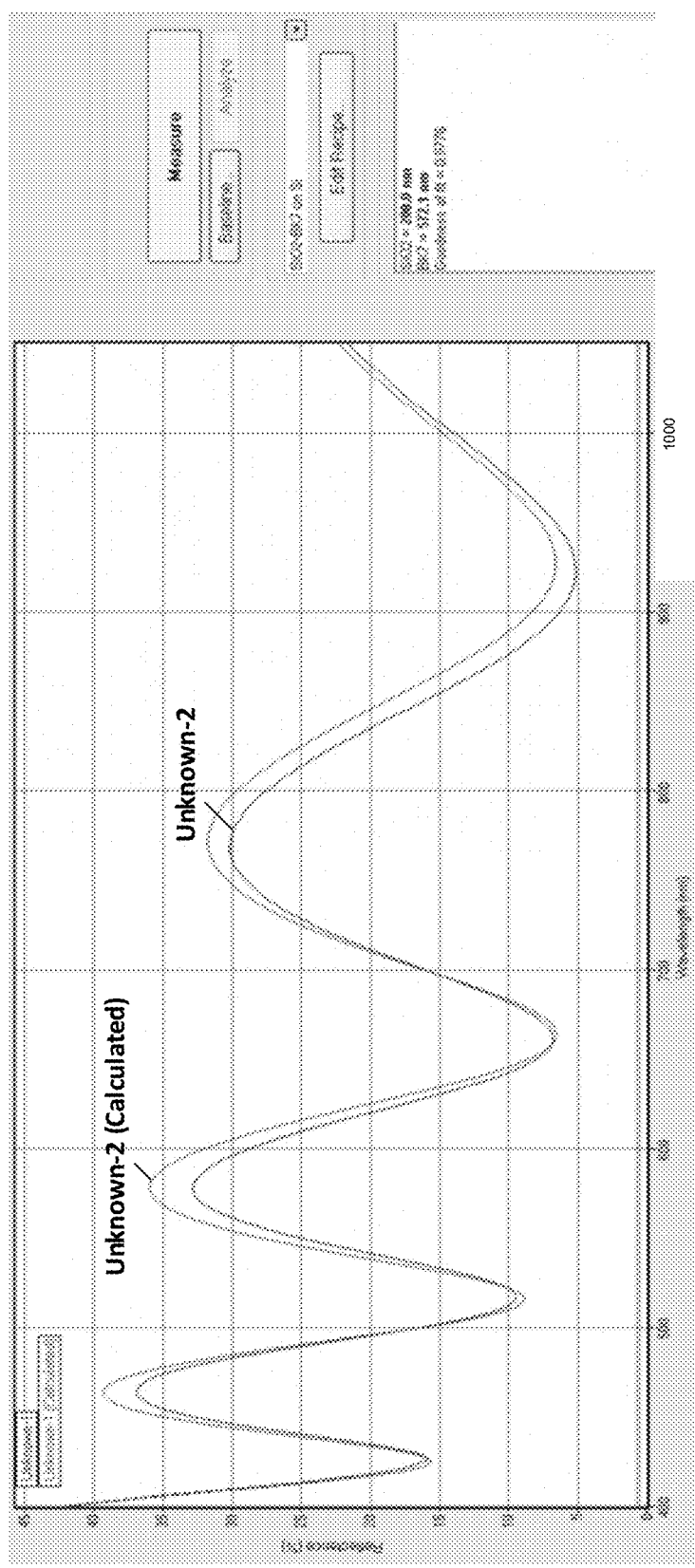
FIG. 17 is a reflectometer graph of a sample after plasma etch in accordance with various embodiments.

Plasma etching depth can be verified with either a profilometer over a masked edge (such as a borosilicate coated silicon witness) or with a reflectometer. A typical step height measurement performed by a profilometer is shown in FIGS. 11-15. FIG. 16 is a reflectometer measurement of the sample before the plasma etch and FIG. 17 is a reflectometer measurement of the sample after the plasma etch.

After the plasma etch, masks and associated residues can be removed with alcohol. Successfully treated layers at this stage in the process were very hydrophilic (approaching 0° water contact angle) and have a dusty crust that was washed off with deionized water.

Acid etching follows the plasma etch step. Areas of the coating can be masked in order to prevent acid exposure. The etchant included a three molar hydrochloric acid solution at a large enough volume to immerse the entire sample, or at least to submerge the borosilicate thin film that requires etching. The solution is heated to 90° C. The coated substrate can be suspended coating-side down or perpendicular to the bottom of the vessel. The solution was agitated or blended to prevent stagnant boron phase from impeding the etching process and ensure that the etched boron phase can be flushed out of the coating. Any areas of the coating that do not get consistent acid flow may show signs of improper etching.

The samples were etched for five to forty five minutes and then removed from the acid and directly placed in a bath of room temperature deionized water for rinsing. It is important to ensure that the coating is submerged during the entirety of the etching and rinsing stages, as residual salts from the acid can adhere to the coating if the acid solution dries on the surface. The sample was rinsed in flowing deionized water for a minimum of 30 minutes.

Superhydrophobic Treatment:

Following the deionized water rinse, the coated samples were superhydrophilic. They can be optionally oxygen plasma etched in the same conditions as the pretreatment stage or otherwise chemically treated in order to open hydroxyl bond sites on the coating. The coating can then be treated in order to chemically attach a hydrophobic chemical such as 1% tridecafluoro-1 1 2 2-tetrahydrooctyl silanes in dry solutions such as hexane. Following chemical treatment, samples can be rinsed with isopropyl alcohol and blown dry with nitrogen. Alternatively, chemical vapor deposition (plasma assisted or not) can be used in place of a wet chemical solution to attach chemicals such as hexamethyldisilazane. Samples can be heat treated at 100° C. for 30 minutes in order to solidify chemical adhesion and remove residual compounds. Samples are superhydrophobic following chemical treatment.

While the foregoing disclosure discusses illustrative embodiments, it should be noted that various changes and modifications could be made herein without departing from the scope of the described aspects and/or embodiments as defined by the appended claims. Furthermore, although elements of the described aspects and/or embodiments may be described or claimed in the singular, the plural is contemplated unless limitation to the singular is explicitly stated.

Additionally, all or a portion of any embodiment may be utilized with all or a portion of any other embodiment, unless stated otherwise.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other changes, combinations, omissions, modifications and substitutions, in addition to those set forth in the above paragraphs are possible. Those skilled in the art will appreciate that various adaptations and modifications of the just described embodiments can be configured without departing from the scope and spirit of the invention. Therefore, it is to be understood that, within the scope of the appended claims, the invention may be practiced other than as specifically described herein.

What is claimed is:

1. A method for producing a superhydrophobic composition comprising a film, the method comprising:
   providing a substrate comprising an inert material;
   depositing a gradient antireflective layer on at least a portion of the substrate;
   decomposing the gradient antireflective layer to form at least a first phase of material and a second phase of material; and
   removing at least a portion of the second phase from the decomposed gradient antireflective layer to form a structured gradient antireflective layer, wherein the superhydrophobic composition has an entire thickness that ranges from 2000 nm to 10,000 nm, wherein a surface of the structured gradient antireflective layer comprises spaced apart protrusions and antireflective nanopores having a major diameter of from 1 µm to 750 nm, wherein the protrusions and nanopores of the gradient antireflective layer decrease in size in a direction from a surface of the gradient antireflective layer to the substrate.

2. The method of claim 1, wherein the step of decomposing the layer comprises:
   subjecting the gradient antireflective layer to flash lamp annealing.

3. The method of claim 2, further comprising:
   creating a temperature gradient based on the flash lamp annealing such that the temperature of the film decreases from an air-layer interface of the film to a substrate-layer interface of the film.

4. The method of claim 3, wherein the gradient antireflective layer is heated and the substrate is not heated.

5. The method of claim 1, wherein the decomposed gradient antireflective layer comprises a silica rich crust, the method further comprising:
   removing the silica rich crust prior to removing at least a portion of the second phase.

6. The method of claim 5, further comprising:
subjecting the silica crust to a plasma etching process.

7. The method of claim 1, further comprising:
applying a hydrophobic silane composition to the structured gradient antireflective layer.

8. The method of claim 7, wherein the hydrophobic silane comprises a molecule of the structure:

Xy(CH3)(3-y)SiLR, where y is 1 to 3;

X is Cl, Br, I, H, HO, R'HN, R'2N, imidizolo, R'C(O)N(H), R'C(O)N(R"), R'O, F3CC(O)N(H), F3CC(O)N(CH3), or F3S(O)2O, where R' is a straight or branched chain hydrocarbon of 1 to 4 carbons and R" is methyl or ethyl;

L, a linking group, is CH2CH2, CH2CH2CH2, CH2CH2O, CH2CH2CH2O, CH2CH2C(O), CH2CH2CH2C(O), CH2CH2OCH2, CH2CH2CH2OCH2; and R is (CF2)nCF3 or (CF(CF3)OCF2)nCF2CF3, where n is 0 to 24.

9. The method of claim 1, wherein the film is transparent, superhydrophobic, or antireflective.

10. The method of claim 1, further comprising:
subjecting the gradient antireflective layer to an oxygen plasma process.

11. A superhydrophobic composition comprising a film, the film comprising:
a substrate comprising an inert material; and
a gradient antireflective layer adjacent to the substrate, wherein the superhydrophobic composition has an entire thickness that ranges from 2000 nm to 10,000 nm, wherein a surface of the gradient antireflective layer comprises spaced apart protrusions and antireflective nanopores having a major diameter of from 1 µm to 750 nm, wherein the protrusions and nanopores of the gradient antireflective layer decrease in size in a direction from a surface of the gradient antireflective layer to the substrate.

12. The superhydrophobic composition of claim 11, further comprising:
a superhydrophobic layer positioned adjacent to the spaced apart protrusions.

13. The superhydrophobic composition of claim 12, wherein the superhydrophobic layer is formed from a hydrophobic silane comprising a molecule of the structure:

Xy(CH3)(3-y)SiLR, where y is 1 to 3;

X is Cl, Br, I, H, HO, R'HN, R'2N, imidizolo, R'C(O)N(H), R'C(O)N(R"), R'O, F3CC(O)N(H), F3CC(O)N(CH3), or F3S(O)2O, where R' is a straight or branched chain hydrocarbon of 1 to 4 carbons and R" is methyl or ethyl;

L, a linking group, is CH2CH2, CH2CH2CH2, CH2CH2O, CH2CH2CH2O, CH2CH2C(O), CH2CH2CH2C(O), CH2CH2OCH2, CH2CH2CH2OCH2; and R is (CF2)nCF3 or (CF(CF3)OCF2)nCF2CF3, where n is 0 to 24.

14. The superhydrophobic composition of claim 12, wherein the superhydrophobic layer is formed from a hydrophobic silane comprising 1H,1H,2H,2H-perfluorooctyl-trichlorosilane.

15. A superhydrophobic composition comprising a film, the film comprising:
a substrate, the substrate comprising a chemically reactive surface;
a gradient antireflective layer chemically bonded to the chemically reactive surface of the substrate, wherein the superhydrophobic composition has an entire thickness that ranges from 2000 nm to 10,000 nm;
wherein a surface of the gradient antireflective layer comprises spaced apart protrusions and antireflective nanopores having a major diameter of from 1 µm to 750 nm, wherein the protrusions and nanopores of the gradient antireflective layer decrease in size in a direction from a surface of the gradient antireflective layer to the substrate;
a superhydrophobic layer chemically bonded to the surface of the gradient antireflective layer; and
wherein the film is superhydrophobic and transparent.

16. The superhydrophobic composition of claim 15, wherein the superhydrophobic layer is positioned adjacent to the spaced apart protrusions.

17. The superhydrophobic composition of claim 16, wherein the superhydrophobic layer is formed from hydrophobic silane comprising a molecule of the structure:

Xy(CH3)(3-y) SiLR, where y is 1 to 3;

X is Cl, Br, I, H, HO, R'HN, R'2N, imidizolo, R'C(O)N(H), R'C(O)N(R"), R'O, F3CC(O)N(H), F3CC(O)N(CH3), or F3S(O)2O, where R' is a straight or branched chain hydrocarbon of 1 to 4 carbons and R" is methyl or ethyl;

L, a linking group, is CH2CH2, CH2CH2CH2, CH2CH2O, CH2CH2CH2O, CH2CH2C(O), CH2CH2CH2C(O), CH2CH2OCH2, CH2CH2CH2OCH2; and R is (CF2)nCF3 or (CF(CF3)OCF2)nCF2CF3, where n is 0 to 24.

18. The superhydrophobic composition of claim 16, wherein the superhydrophobic layer is formed from a hydrophobic silane comprising 1H,1H,2H,2H-perfluorooctyl-trichlorosilane.

* * * * *